(12) United States Patent
Balakrishnan et al.

(10) Patent No.: US 10,332,972 B2
(45) Date of Patent: Jun. 25, 2019

(54) SINGLE COLUMN COMPOUND SEMICONDUCTOR BIPOLAR JUNCTION TRANSISTOR FABRICATED ON III-V COMPOUND SEMICONDUCTOR SURFACE

(71) Applicant: International Business Machines Corporation, Armonk, NY (US)

(72) Inventors: Karthik Balakrishnan, White Plains, NY (US); Pouya Hashemi, White Plains, NY (US); Tak H. Ning, Yorktown Heights, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/818,377

(22) Filed: Nov. 20, 2017

(65) Prior Publication Data

US 2019/0157416 A1    May 23, 2019

(51) Int. Cl.
*H01L 29/04* (2006.01)
*H01L 29/08* (2006.01)
(Continued)

(52) U.S. Cl.
CPC .......... *H01L 29/6631* (2013.01); *H01L 29/04* (2013.01); *H01L 29/0804* (2013.01);
(Continued)

(58) Field of Classification Search
CPC .......... H01L 29/0676; H01L 29/732–29/7327; H01L 29/66318; H01L 29/267; H01L 29/1004
See application file for complete search history.

(56) References Cited

U.S. PATENT DOCUMENTS 4,853,342 A * 8/1989 Taka .................... H01L 21/2022
                                                                438/283
4,868,633 A * 9/1989 Plumton ................ H01L 21/28
                                                                372/45.01
(Continued)

FOREIGN PATENT DOCUMENTS

CN       106170868 A    11/2016
JP        08186123 A     7/1996
(Continued)

OTHER PUBLICATIONS

Dambrine et al., "An overview of low noise devices and associated circuits for 100-200 GHz space applications", 11th GAAS Symposium, Munich 2003, pp. 473-476.*

*Primary Examiner* — Yu Chen
*Assistant Examiner* — Vincent Wall
(74) *Attorney, Agent, or Firm* — L. Jeffrey Kelly, Esq.; Hoffmann & Baron, LLP

(57) ABSTRACT

A vertical, single column compound semiconductor bipolar junction transistor device includes an all-around extrinsic base. Homojunction and heterojunction devices are formed using III-V compound semiconductor materials with appropriate bandgaps. Fabrication of the transistor device includes epitaxially growing a III-V compound semiconductor base region on a heavily doped III-V compound semiconductor bottom layer. A polycrystalline emitter/collector layer and the all-around extrinsic base are grown on the base region.

12 Claims, 21 Drawing Sheets

(51) Int. Cl.
*H01L 29/10* (2006.01)
*H01L 29/20* (2006.01)
*H01L 29/66* (2006.01)
*H01L 29/732* (2006.01)

(52) U.S. Cl.
CPC ...... *H01L 29/0821* (2013.01); *H01L 29/1004* (2013.01); *H01L 29/20* (2013.01); *H01L 29/7325* (2013.01)

(56) References Cited

U.S. PATENT DOCUMENTS

| | | | | |
|---|---|---|---|---|
| 5,147,775 | A * | 9/1992 | Ota | H01L 29/1004 148/DIG. 10 |
| 5,481,120 | A * | 1/1996 | Mochizuki | H01L 29/0891 257/192 |
| 5,587,327 | A * | 12/1996 | Konig | H01L 29/66242 148/DIG. 11 |
| 9,391,181 | B2 | 7/2016 | Chu-Kung et al. | |
| 2002/0117665 | A1* | 8/2002 | Yaegassi | H01L 29/66318 257/47 |
| 2009/0200641 | A1* | 8/2009 | Hurkx | B82Y 10/00 257/565 |
| 2014/0175509 | A1 | 6/2014 | Chu-Kung et al. | |
| 2016/0322228 | A1 | 11/2016 | Mochizuki et al. | |
| 2016/0322392 | A1 | 11/2016 | Mochizuki et al. | |
| 2017/0012125 | A1 | 1/2017 | Le et al. | |
| 2017/0018606 | A1 | 1/2017 | Chan et al. | |

FOREIGN PATENT DOCUMENTS

| | | |
|---|---|---|
| KR | 1020160137970 A | 12/2016 |
| WO | 2012175716 A1 | 12/2012 |

* cited by examiner

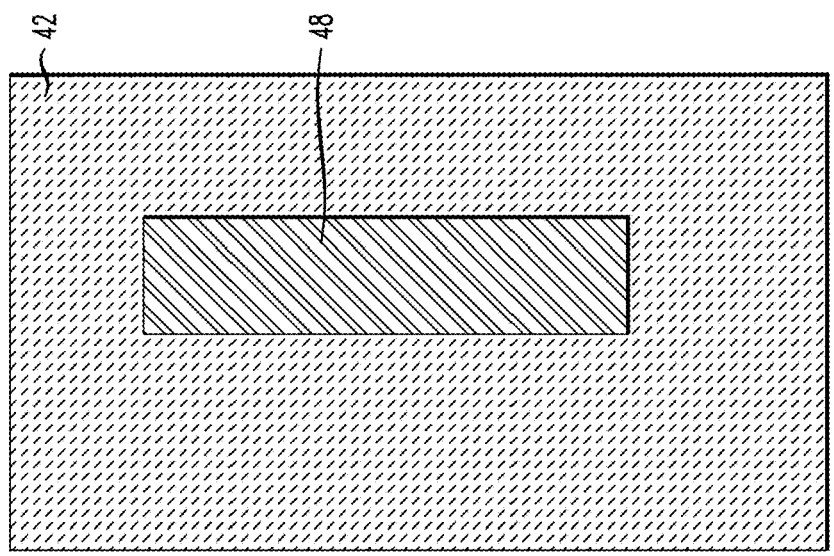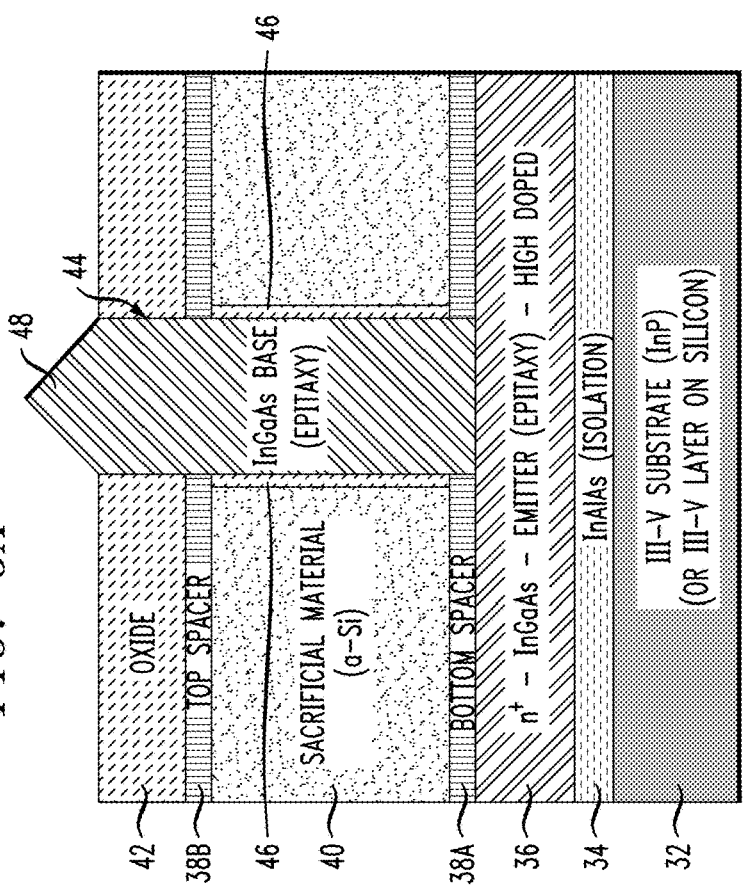
FIG. 6A
FIG. 6B

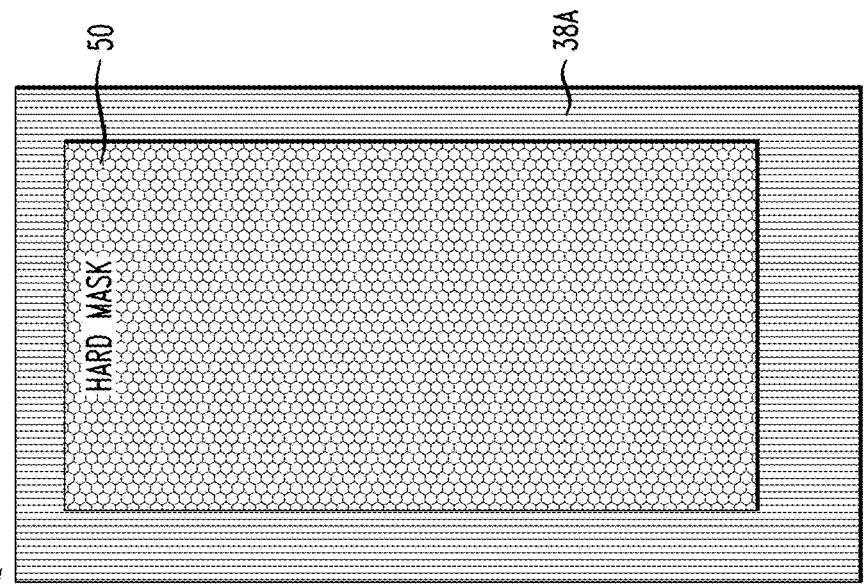
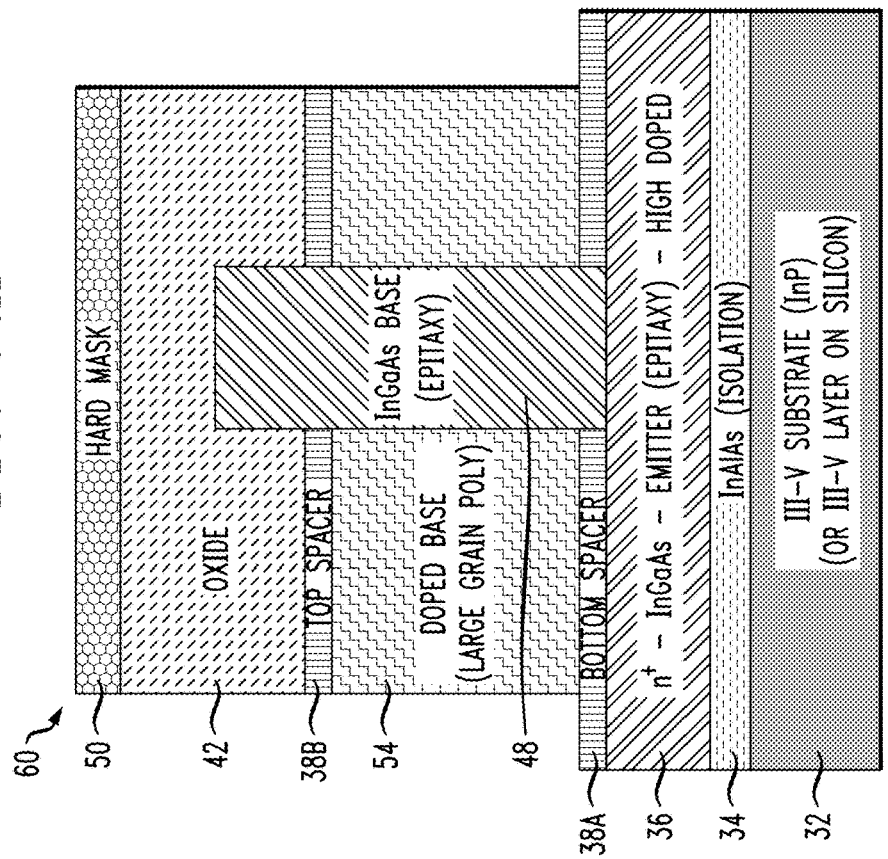

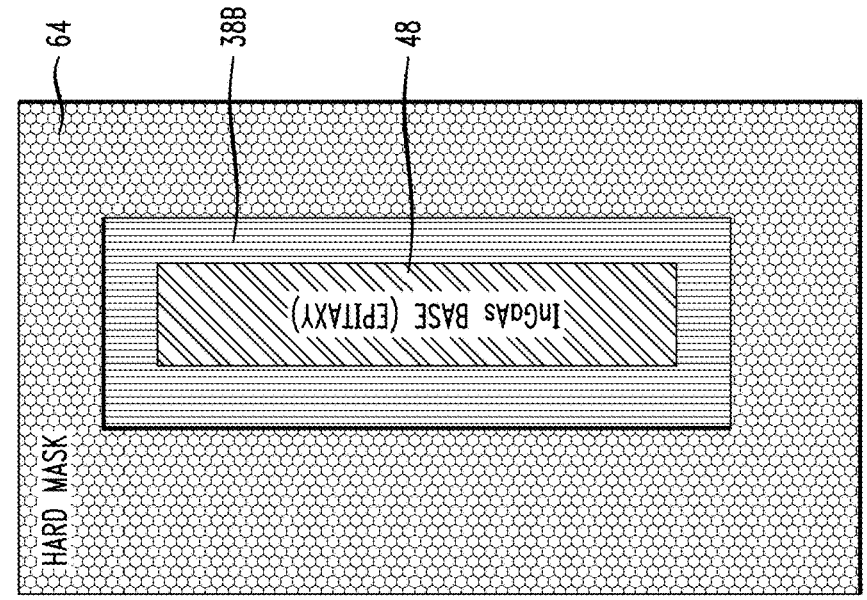
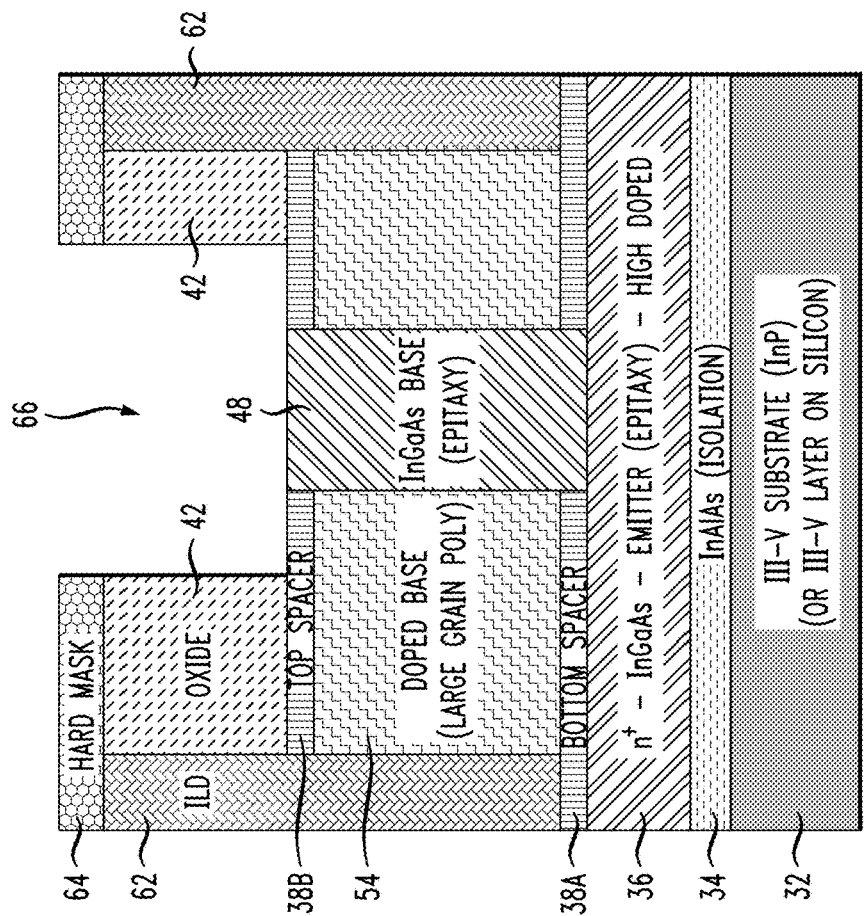
FIG. 18A
FIG. 18B

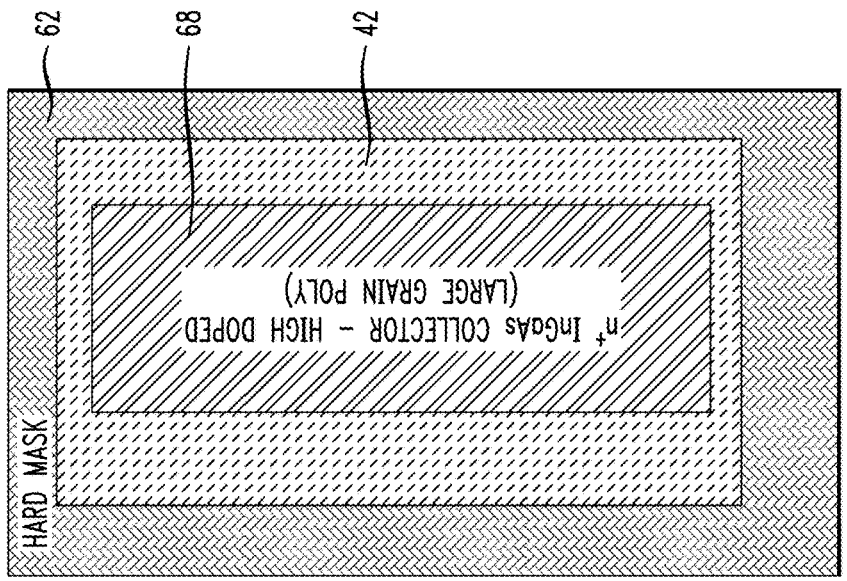
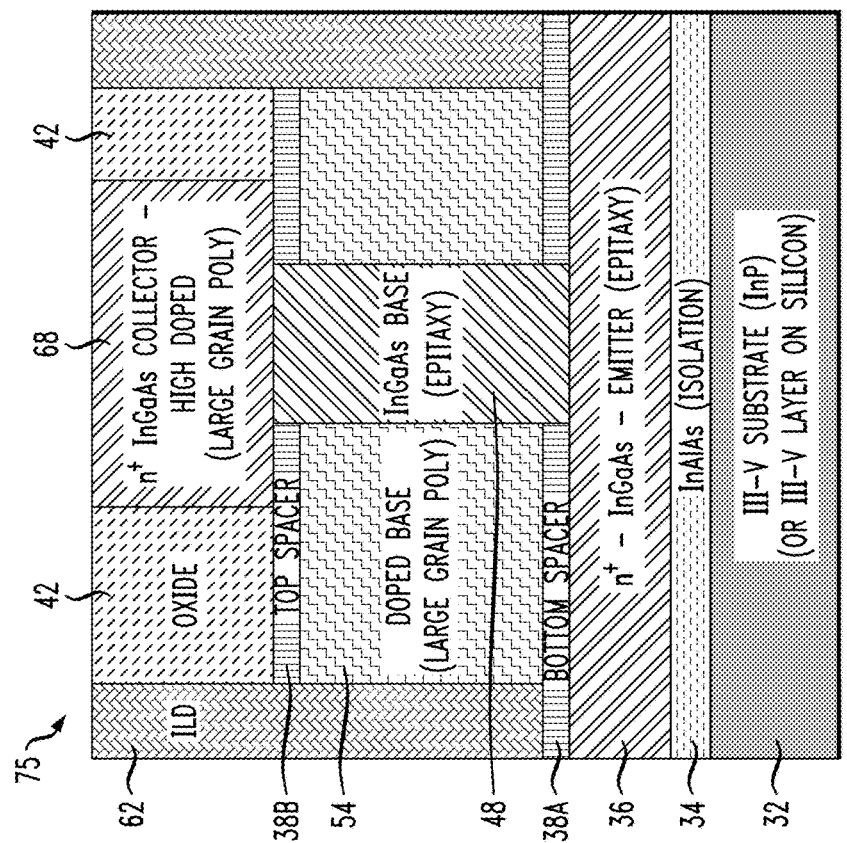

SINGLE COLUMN COMPOUND SEMICONDUCTOR BIPOLAR JUNCTION TRANSISTOR FABRICATED ON III-V COMPOUND SEMICONDUCTOR SURFACE

BACKGROUND

The present disclosure relates generally to the electronic arts and, more particularly, to bipolar junction transistors and their fabrication.

Bipolar junction transistors include emitter, collector and base regions. A biasing voltage applied between a base contact and an emitter contact allows control of collector current. Bipolar junction transistors can be employed as sensors, switches, amplifiers, and for high performance and/or high voltage applications. A heterojunction bipolar transistor, which is a type of bipolar junction transistor, includes a bandgap difference between the emitter and base.

Bipolar junction transistors using compound semiconductors are suitable for high performance applications when small-bandgap semiconductor materials are used and for high voltage applications when large bandgap semiconductor materials are used.

BRIEF SUMMARY

Bipolar junction transistor structures and techniques for fabricating such structures are disclosed.

In one aspect, an exemplary single column bipolar junction transistor device includes a substrate including a III-V compound semiconductor surface, an isolation layer on the III-V compound semiconductor surface, and a vertical column on the isolation layer. The vertical column includes a bottom semiconductor layer having a first conductivity type, a top III-V compound semiconductor layer, and a base layer. The bottom semiconductor layer is heavily doped and consists essentially of an epitaxially grown III-V compound semiconductor material. The isolation layer is between the III-V compound semiconductor surface and the bottom semiconductor layer. The top semiconductor layer is heavily doped and has the first conductivity type. The doped III-V compound semiconductor base layer has a second conductivity type opposite to the first conductivity type and is epitaxially grown on the bottom semiconductor layer. The base layer is located between and directly contacts the bottom and top semiconductor layers. A doped extrinsic base completely surrounds and directly contacts the base layer. A base contact is electrically connected to the doped extrinsic base.

In another aspect, an exemplary method of fabricating a structure including single column bipolar junction transistor device includes obtaining a multi-layer structure including a substrate having a III-V compound semiconductor surface, an isolation layer on the III-V compound semiconductor surface, a bottom semiconductor layer having a first conductivity type, a sacrificial layer over the bottom semiconductor layer, and a dielectric layer over the sacrificial layer. The bottom semiconductor layer is heavily doped and consists essentially of a III-V compound semiconductor material. The isolation layer is located between the III-V compound semiconductor surface and the bottom semiconductor layer. The method further includes forming a trench extending vertically through the dielectric layer and the sacrificial layer and epitaxially growing a doped III-V compound semiconductor base layer on the bottom semiconductor layer and within the trench. The base layer has a second conductivity type opposite to the first conductivity type. The sacrificial layer is removed, thereby forming a space extending around the base layer. A doped extrinsic base is grown on and completely surrounds the base layer. The extrinsic base extends within the space extending around the base layer. A heavily doped III-V compound top semiconductor layer having the first conductivity type is grown on a top surface of the base layer.

Techniques and devices as disclosed herein can provide substantial beneficial technical effects. By way of example only and without limitation, one or more embodiments may provide one or more of the following advantages:
  Relatively small base-collector capacitance;
  Emitter/collector can be symmetrical if desired;
  Allows bottom-up formation of bipolar junction transistor devices.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 6A and 6B are schematic, cross-sectional and top plan views, respectively, showing III-V compound semiconductor base material formed in the trench of the structure depicted in FIGS. 5A and 5B;

FIGS. 14A and 14B are schematic, cross-sectional and top plan views, respectively, of the structure shown in FIGS. 13A and 13B following recessing of unprotected portions of the base region;

FIGS. 18A and 18B are schematic, cross-sectional and top plan views, respectively, of the structure shown in FIGS. 17A and 17B following formation of a recess therein;

FIGS. 20A and 20B are schematic, cross-sectional and top plan views, respectively, of the structure shown in FIGS. 19A and 19B following removal of the collector mask.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative vertical single column compound semiconductor bipolar junction transistors fabricated on a silicon substrate. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1B:
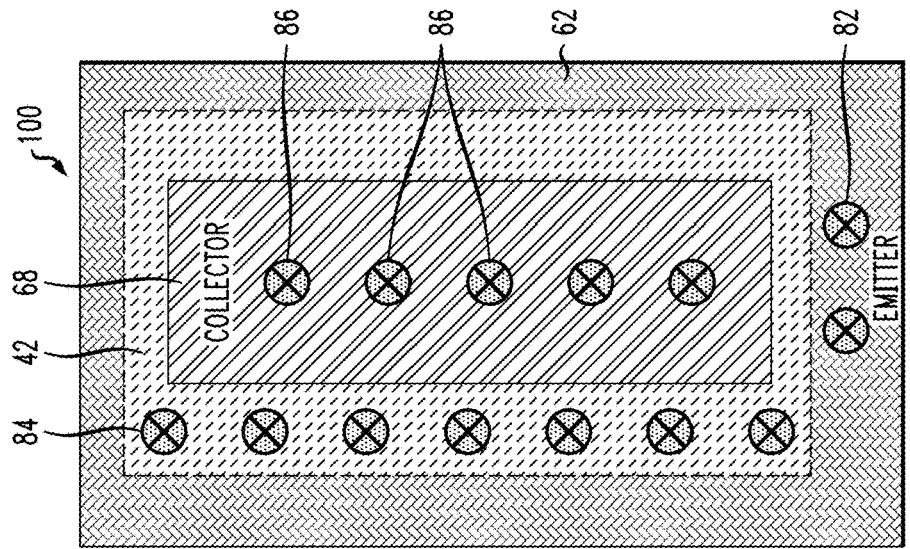
FIGS. 1A and 1B are schematic, cross-sectional and top plan views, respectively, depicting an exemplary single column bipolar junction transistor (BJT) having an all-around base.
Figure 1A:
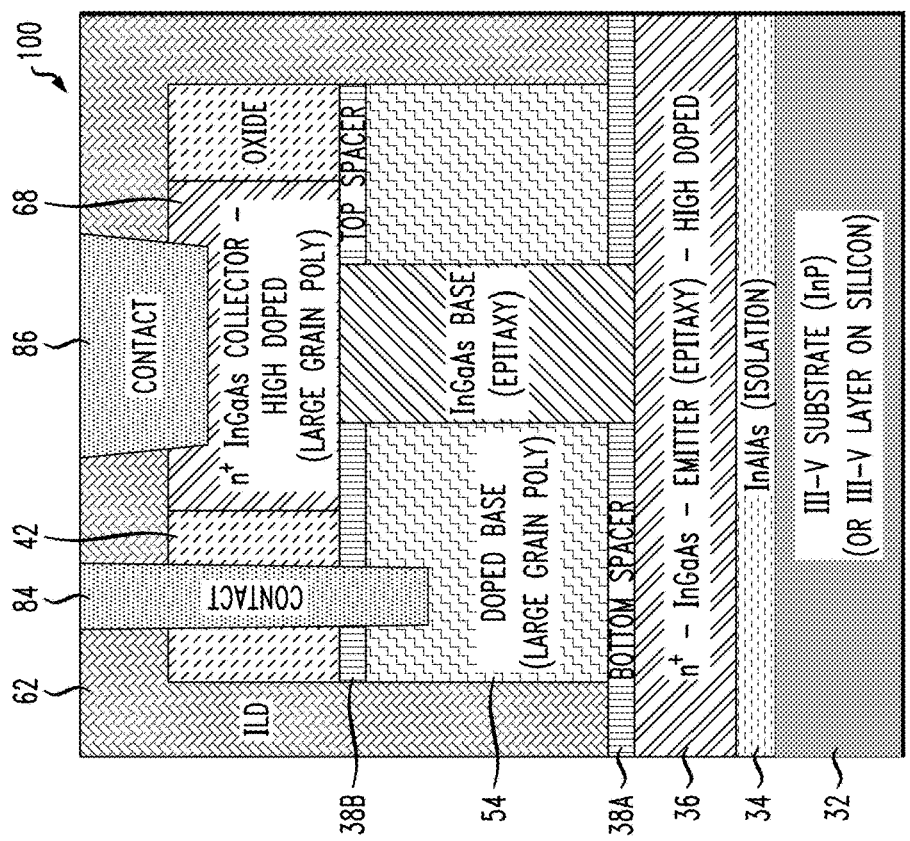

FIGS. 1A and 1B are cross-sectional and top plan views, respectively, that schematically depict a structure 100 including an exemplary single column compound semiconductor bipolar junction transistor (BJT) on a III-V compound semiconductor surface. FIGS. 2-21 schematically illustrate an exemplary sequence of fabrication steps that may be employed in obtaining the BJT. By way of example only and without limitation, FIGS. 2-21 are views depicting exemplary processing steps/stages in the fabrication of an exemplary vertical BJT having an all-around base. Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. While some individual processing steps are set forth herein, those steps are merely illustrative, and one skilled in the art may be familiar with several equally suitable alternatives that would be applicable.

Figure 2:
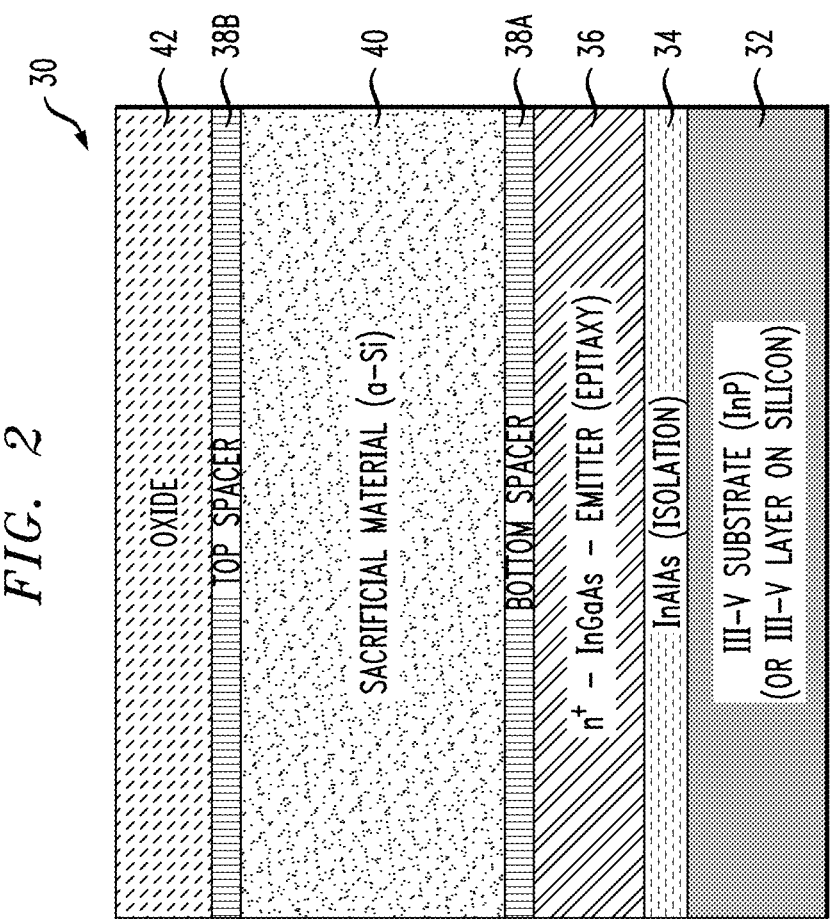
FIG. 2 is a schematic, cross-sectional view showing a III-V compound semiconductor substrate having compound semiconductor layers and dielectric layers thereon.

With reference now to FIG. 2, a multi-layer structure 30 includes a III-V compound semiconductor substrate 32, a relatively wide bandgap semi-isolation layer 34, a heavily doped III-V compound semiconductor layer 36 that may later function as a BJT emitter, bottom and top spacers 38A, 38B, a sacrificial layer 40 between the spacers, and a dielectric (e.g. oxide) layer 42 on the top spacer. The substrate 32 has a surface portion of III-V compound semiconductor material that allows the subsequent epitaxial growth of III-V compound semiconductor materials thereon without the difficulties and problems associated with growing such material on substrates where a significant lattice mismatch would be present. The substrate 32 may alternatively comprise a relaxed III-V layer on a silicon wafer. In an exemplary embodiment, the III-V material comprising the substrate is InP.

The structure 30 is obtained by first epitaxially growing the layer 34 of semi-insulating material on the substrate 32. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In an exemplary embodiment using an InP substrate, the semi-isolating layer consists essentially of InAlAs.

The heavily doped III-V compound semiconductor layer 36 is epitaxially grown on the semi-isolating layer 34. The lattice constants of $In_{0.53}Ga_{0.47}As$, InAlAs ($In_{0.52}Al_{0.48}As$), and InP are substantially the same, allowing a high quality InGaAs layer to be grown on an InAlAs layer. The bandgap of InAlAs is substantially greater than the bandgap of InGaAs and is therefore capable of providing electrical isolation. The dopants in the semiconductor layer 36 may be incorporated in situ using appropriate precursors, as known in the art. In one exemplary embodiment, the heavily doped InGaAs layer has a doping concentration of 1e19-2e21 $cm^{-3}$ or greater and n-type conductivity. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminium, gallium and indium. As used herein, "n-type" refers to the addition of impurities that contributes free electrons to an intrinsic semiconductor. Silicon can be used as an n-type or p-type dopant in III-V semiconductor materials. Other n-type dopants that can be used in III-V semiconductor materials include tellurium, tin and germanium while other p-type dopants include zinc and carbon. The thickness of the heavily doped III-V layer 36 may be in the range of 5 nm to 40 nm. A larger bandgap III-V compound semiconductor material (e.g. GaAs) can be employed for high voltage or power transistor applications. In an exemplary embodiment in which a heterojunction bipolar transistor is formed, the semiconductor layer 36 could consist essentially of InGaAlAs and function as an emitter. The inclusion of a small percentage of aluminium (Al) widens the bandgap. The percentage of indium (In) in the emitter of the heterojunction device can be a few percent higher than in the subsequently formed III-V base layer to compensate for lattice shrinkage due to the smaller size of the aluminium atom.

III-V compound semiconductors are obtained by combining group III elements (for example, Al, Ga, In) with group V elements (for example, N, P, As, Sb). GaAs, InGaAs, InP, GaP, and GaN are examples of III-V compound semiconductors. Many different III-V compounds could be grown on the substrate 32 and accordingly multiple precursors could be used. Depending on which III-V material(s) is to be grown and which precursor is used, different parameters (temperature, process pressure, times, etc.) are applicable. Metalorganic precursors include Trimethylgallium, Trimethylaluminum, Trimethylindium, Trimethylantimony, Tertiarybutylarsine and Tertiarybutylphosphine. Alternate Group V precursors include arsine and phosphine. Depending which Group V source is used, process temperature, gas flow, pressure and times vary significantly. The process parameters for growing III-V semiconductor materials on silicon and on other III-V semiconductor materials are well known in the art and new methods continue to be developed.

The bottom and top spacers 38A, 38B may be silicon nitride spacers. The bottom spacer 38A is deposited as a blanket layer on the doped epitaxial III-V layer 36. "Blanket" deposition refers to the deposition of the layer without masking of the underlying substrate material. The spacers can be deposited using directional deposition techniques including, but not necessarily limited to high density plasma (HDP) deposition and gas cluster ion beam (GCIB) deposition, or deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering.

The sacrificial layer 40 deposited on the bottom spacer 38A may be an amorphous silicon (a-Si) or a polycrystalline silicon (polysilicon) layer that can be etched selectively to the spacer material. The sacrificial layer material may be deposited by a deposition process such as, but not limited to, physical vapor deposition (PVD), chemical vapor deposition (CVD), plasma enhanced chemical vapor deposition (PECVD), inductively coupled plasma chemical vapor deposition (ICP CVD), or any combination thereof. Hydrogenated amorphous silicon is typically deposited by plasma-enhanced chemical vapor deposition (PECVD) although other techniques such as hot-wire chemical vapor deposition (HWCVD) may be used. The top spacer 38B is deposited on the top surface of the sacrificial layer 40.

The oxide layer 42 is deposited on the top surface of the top spacer 38B. Non-limiting examples of materials for the oxide layer 42 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The oxide layer 42 has a thickness in a range from about one hundred to one thousand nanometers in some embodiments, though such a thickness range is not considered critical.

Figure 3B:
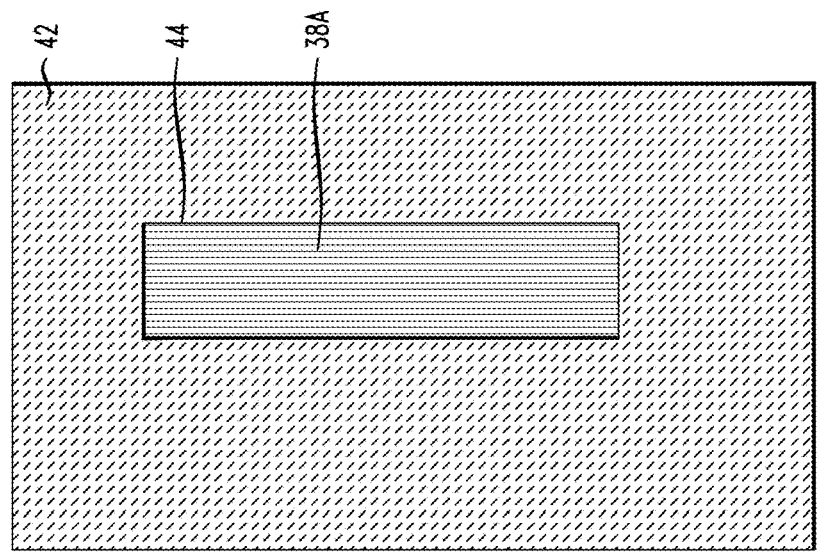
FIGS. 3A and 3B are schematic, cross-sectional and top plan views, respectively, showing the structure of FIG. 2 following formation of a trench therein.
Figure 3A:
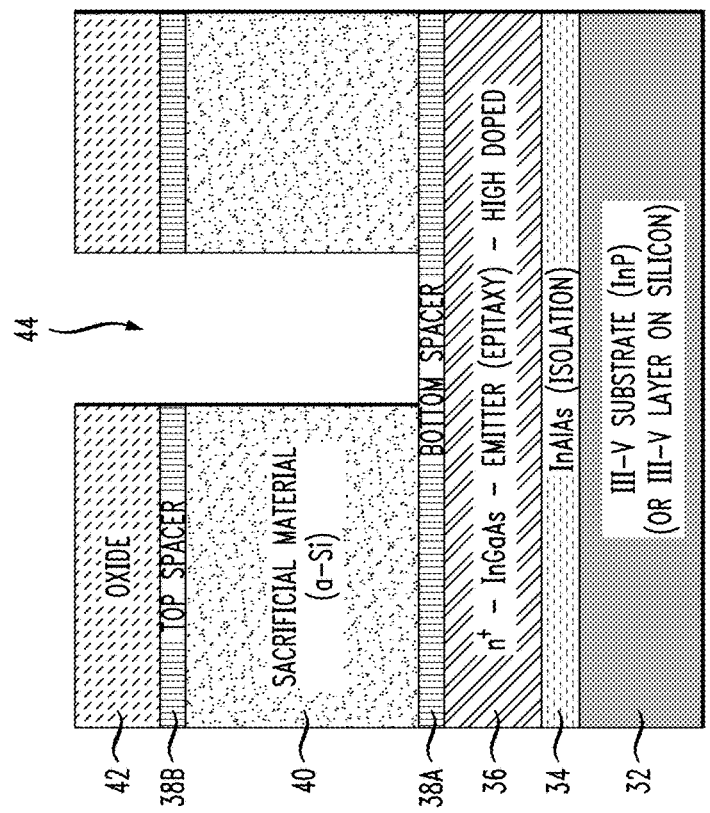

As shown in FIGS. 3A and 3B, a trench 44 is formed in the structure 30. The etch process used to form the trench 44 may be, for example, a reactive ion etch (ME) such that the trench includes substantially vertical side walls. Sequential RIE processes are employed to etch through the oxide layer 42, the top spacer 38B, and the sacrificial layer 40, respectively. The bottom spacer 38A functions as an etch stop following etching of the sacrificial layer 40. The trench 36 accordingly extends from the top surface of the oxide layer to the bottom spacer 38A. A patterned mask (not shown) having an opening corresponding to the trench location is formed on the top surface of the oxide layer 42 prior to etching the oxide material and the underlying layers. The mask protects the remainder of the structure. A trench 44 having a width between five and fifty nanometers can be formed in the fabrication of a bipolar junction transistor as described further herein.

Figure 4:
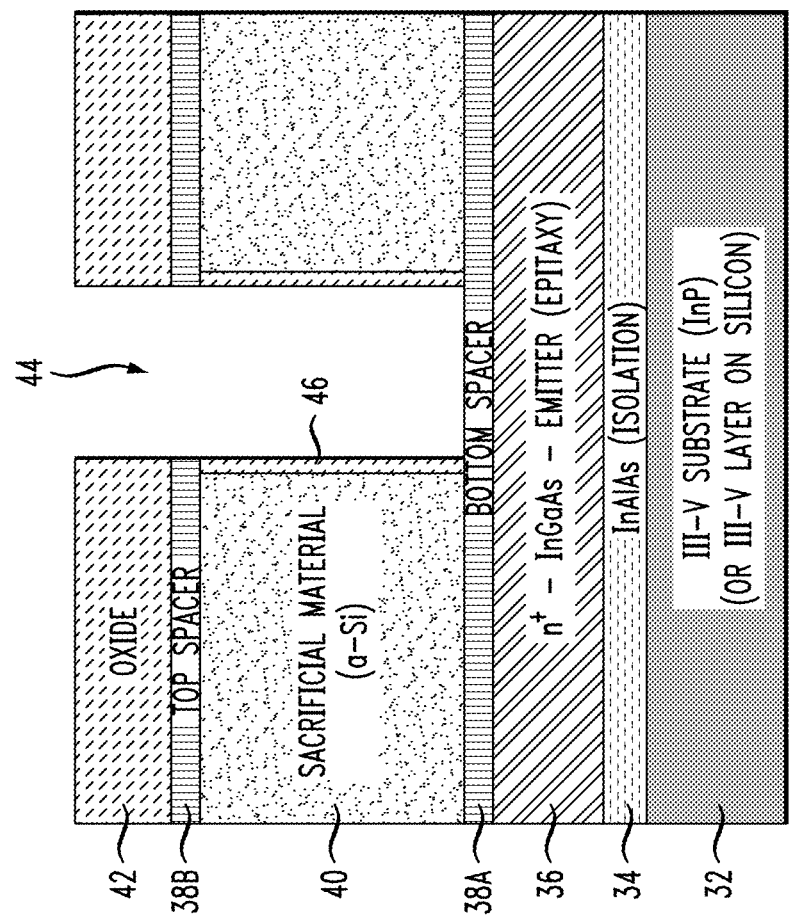
FIG. 4 is a schematic, cross-sectional view of the structure shown in FIGS. 3A and 3B following formation of an oxide layer within the trench.
Figure 5B:
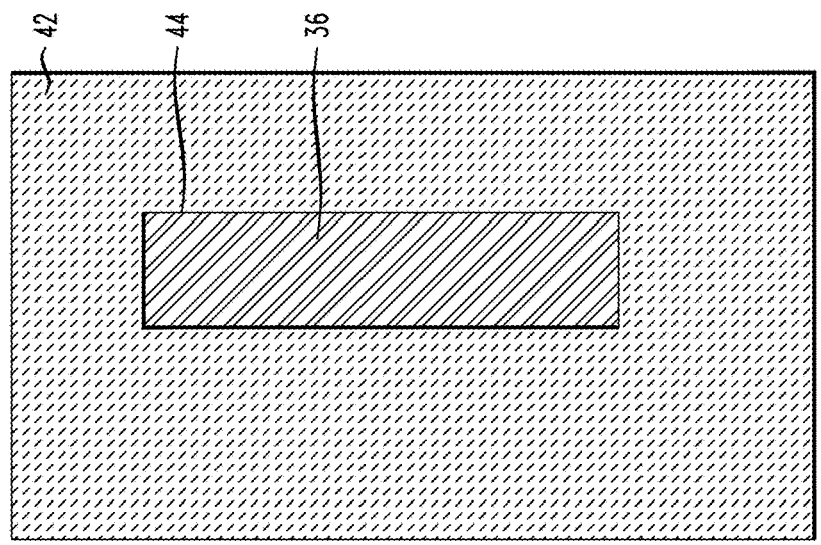
FIGS. 5A and 5B are schematic, cross-sectional and top plan views, respectively, of the structure shown in FIG. 4 following exposure of an emitter layer.
Figure 5A:
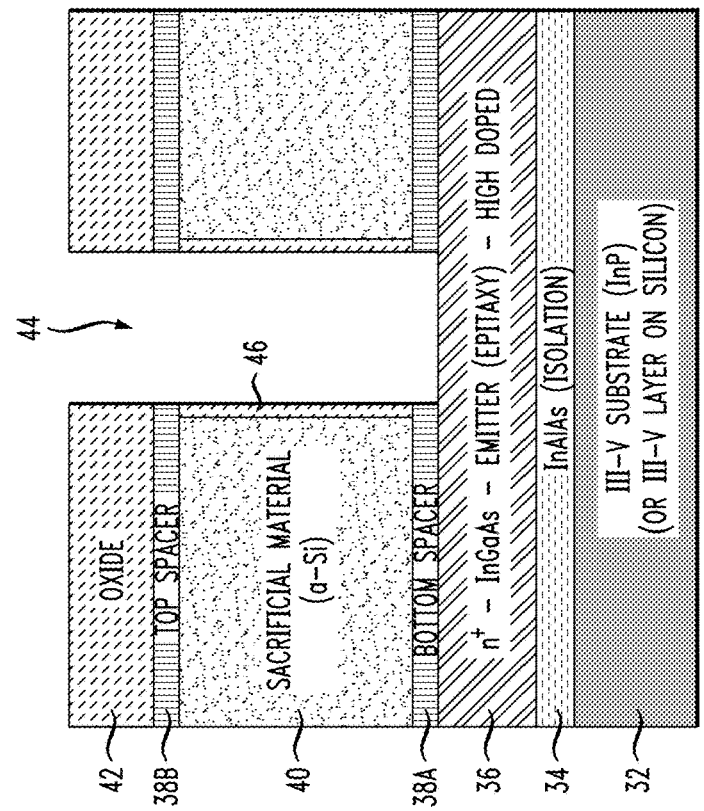

A thin oxide liner 46 is formed on the exposed surfaces of the sacrificial layer 40 within the trench. The oxidation may be performed by a plasma oxidation process or other oxidation process that forms a thin oxide layer thereon. The resulting structure is schematically illustrated in FIG. 4. Following such oxidation, the trench 44 is extended through the bottom spacer 38A to the doped III-V compound semiconductor layer 36. FIGS. 5A and 5B schematically illustrate the resulting structure.

Figure 7:
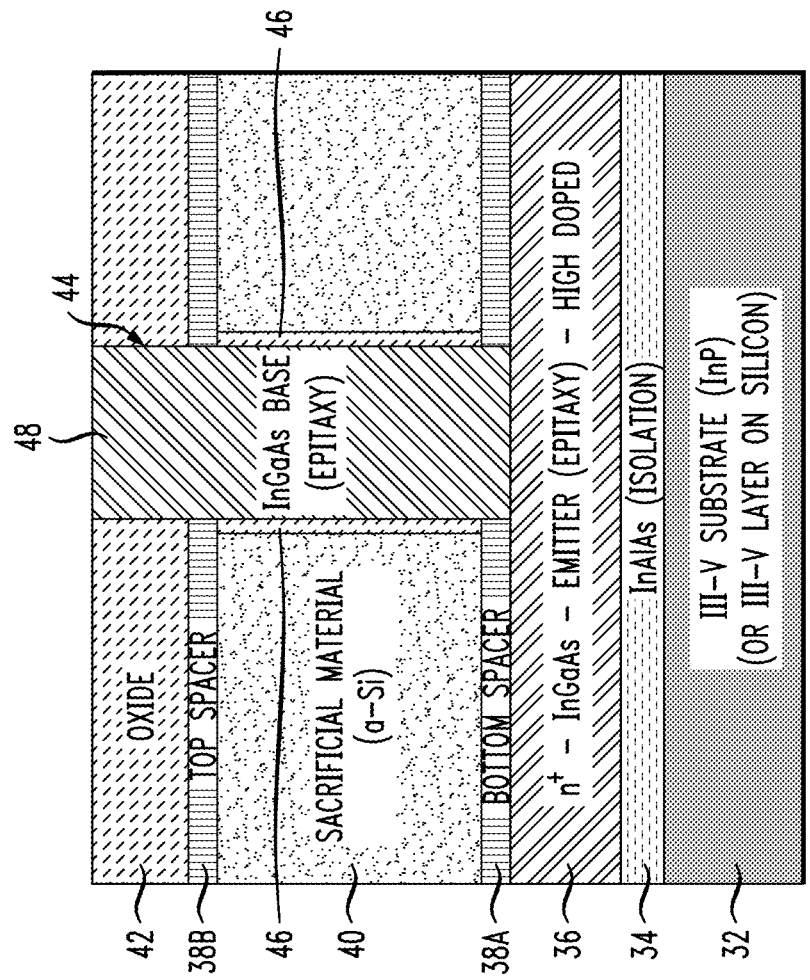
FIG. 7 is a schematic, cross-sectional view of the structure of FIGS. 6A and 6B following planarization thereof.
Figure 8:
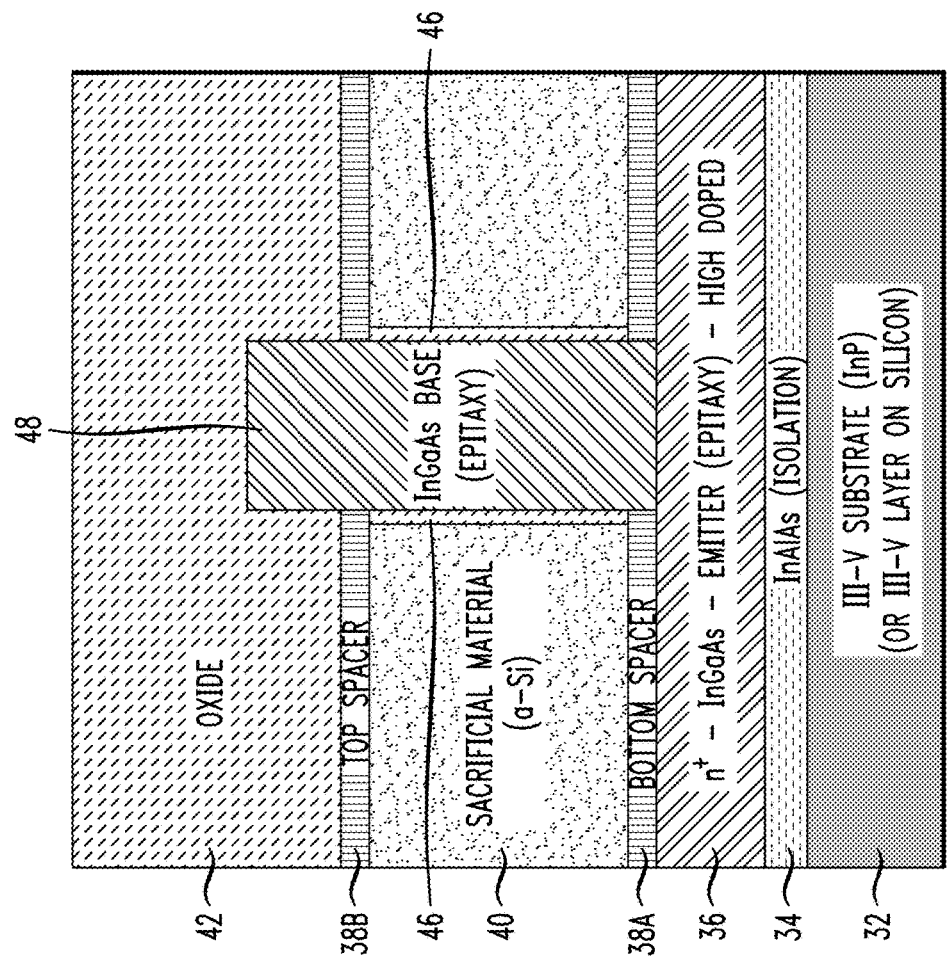
FIG. 8 is a schematic, cross-sectional view showing the structure of FIG. 7 following deposition and planarization of an oxide layer thereon.

BJT base material 48 is epitaxially grown on the exposed surface of the doped III-V compound semiconductor layer 36 within the trench 44. The base material is lattice-matched to the doped III-V compound semiconductor layer 36 or close to lattice-matching. In the latter case, a strained base may be obtained. The deposited base material may be doped in situ such that it has p-type conductivity, the opposite conductivity type of the semiconductor layer 36. The doping concentration of the base material is between 1e17-1e19 cm$^{-3}$ in the exemplary embodiments. The base material 48 optionally consists essentially of the same III-V material as the layer 36 on which it is formed in some embodiments, for example InGaAs having the same stoichiometry as the underlying layer. A homojunction bipolar junction transistor can be fabricated in such embodiments. A portion of the base material (overgrowth) may extend above the top surface of the oxide layer 42. The resulting structure is schematically illustrated in FIGS. 6A and 6B. The structure is polished to remove such overgrowth back to the top surface of the oxide layer, as shown in FIG. 7. Additional oxide material is then deposited and planarized on the structure as shown in FIG. 8, thereby increasing the thickness of the oxide layer 42 such that it covers the exposed surface of the epitaxial base material.

Figure 9B:
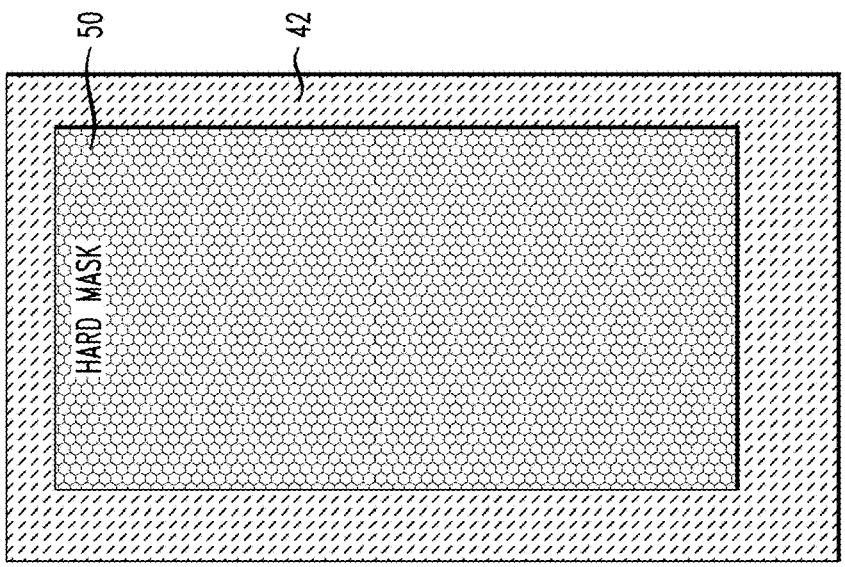
FIGS. 9A and 9B are schematic, cross-sectional and top plan views, respectively, of the structure shown in FIG. 8 following masking of the base region.
Figure 9A:
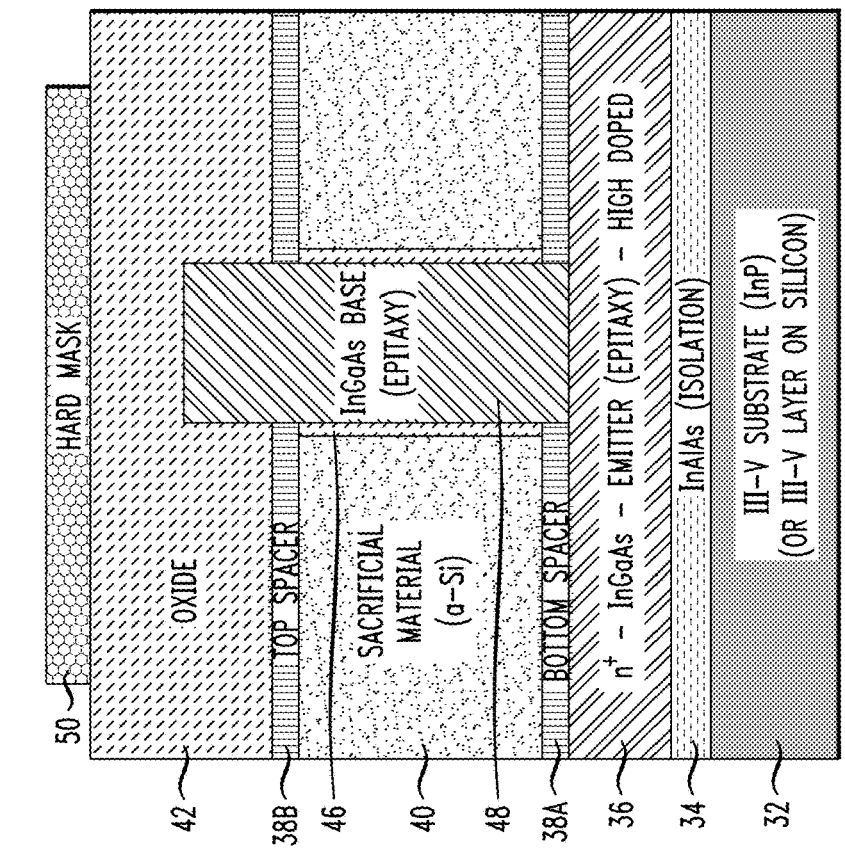
Figure 10B:
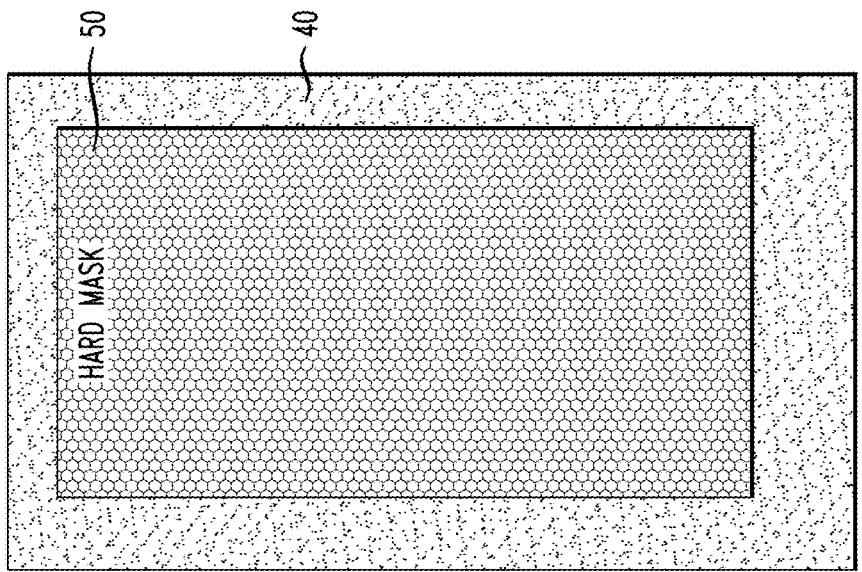
FIGS. 10A and 10B are schematic, cross-sectional and top plan views, respectively, following etching of the unprotected regions of the structure shown in FIG. 9.
Figure 10A:
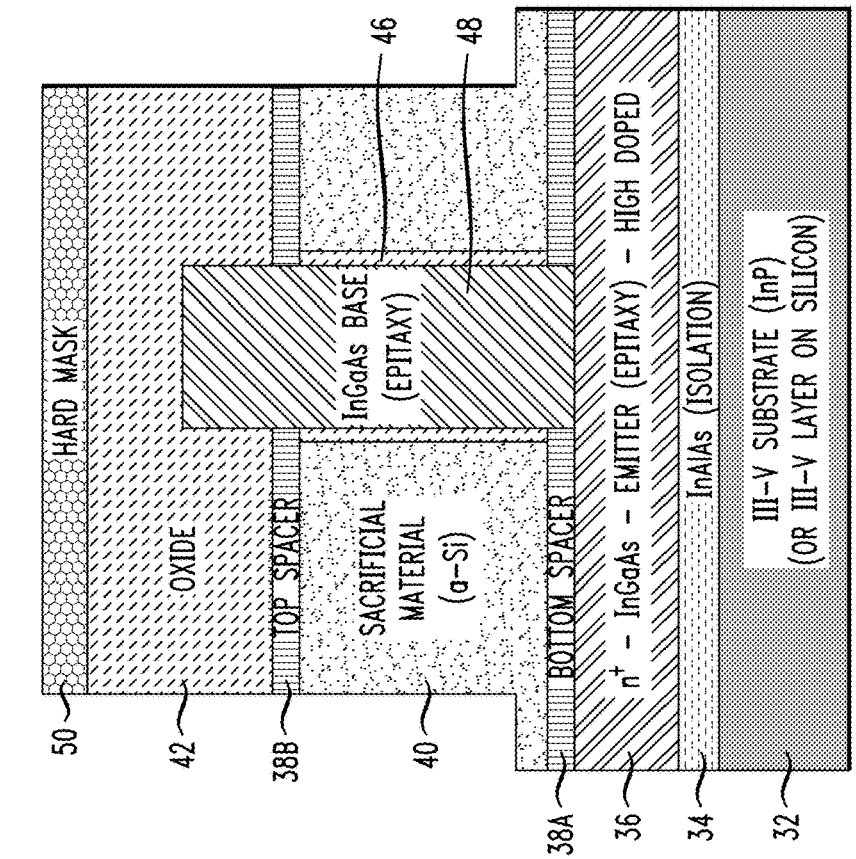

A hard mask 50, for example a silicon nitride mask, is deposited on the oxide layer 42. The hard mask overlaps the base region containing the base material 48 on all sides and thereby protects this region and the surrounding region during subsequent processing. FIGS. 9A and 9B show the structure following deposition and patterning of the hard mask. The periphery of the oxide layer 42 is exposed. The exposed portion of the oxide layer 42 and the portions of the top spacer 38B and sacrificial layer 40 beneath the exposed portion of the oxide layer are recessed using a sequence of reactive ion etch processes, stopping near but not necessarily on the top surface of the bottom spacer 38A. The last phase of the reactive ion etch may be timed to stop within the sacrificial layer 40 as shown in FIGS. 10A and 10B.

Figure 11B:
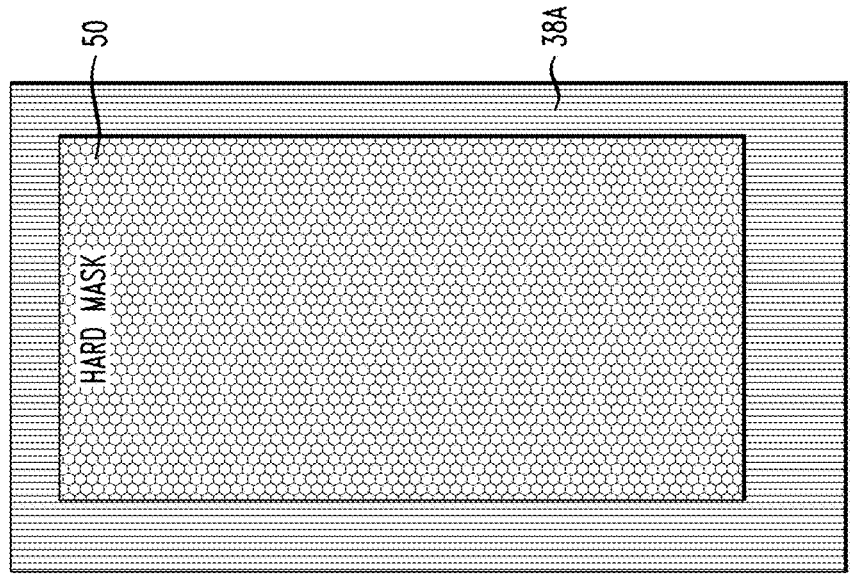
FIGS. 11A and 11B are schematic, cross-sectional and top plan views, respectively, following removal of sacrificial material from the structure shown in FIGS. 10A and 10B.
Figure 11A:
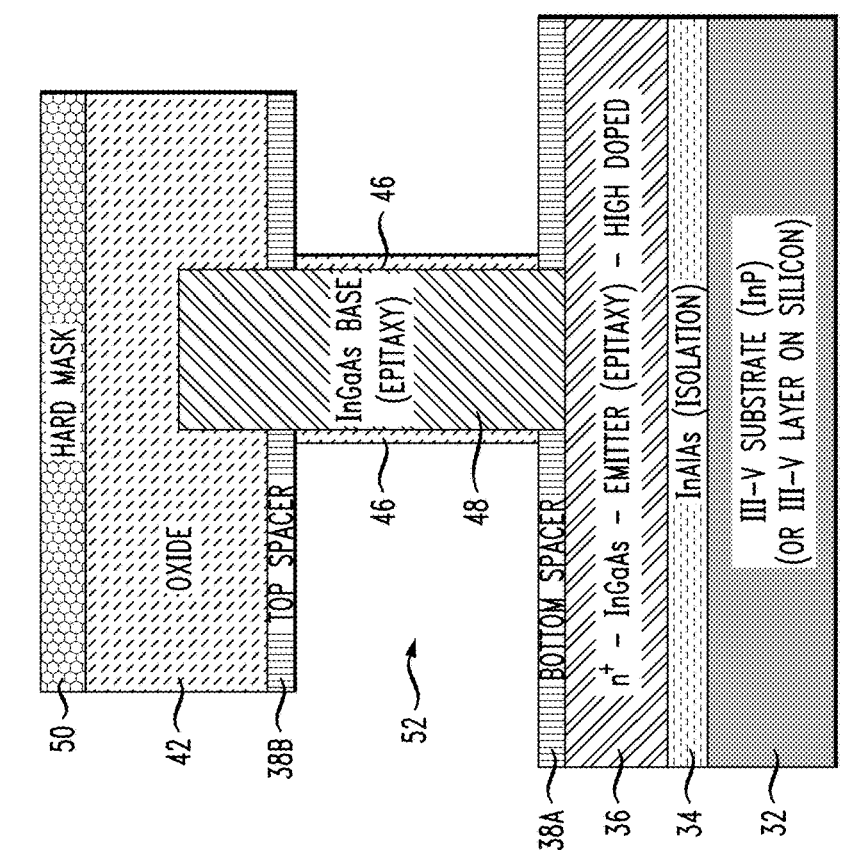

Referring to FIGS. 11A and 11B, the sacrificial layer 40 is removed from the structure to form a space 52 between the bottom and top spacers 38A, 38B. A wet etch using hot ammonia can be introduced to selectively remove the sacrificial layer while leaving the spacers 38A, 38B and the thin oxide liner 46 substantially intact. The thin oxide liner 46 adjoining the base material 48 is then removed to obtain the structure shown in FIG. 12. Such removal can involve using a SiCoNi' etch, a short HF etch, or any other suitable pre-clean process. A SiCoNi' etch is a plasma-assisted dry etch process that involves simultaneous exposure of a substrate to hydrogen, $NF_3$ and $NH_3$ plasma by-products.

Figure 13B:
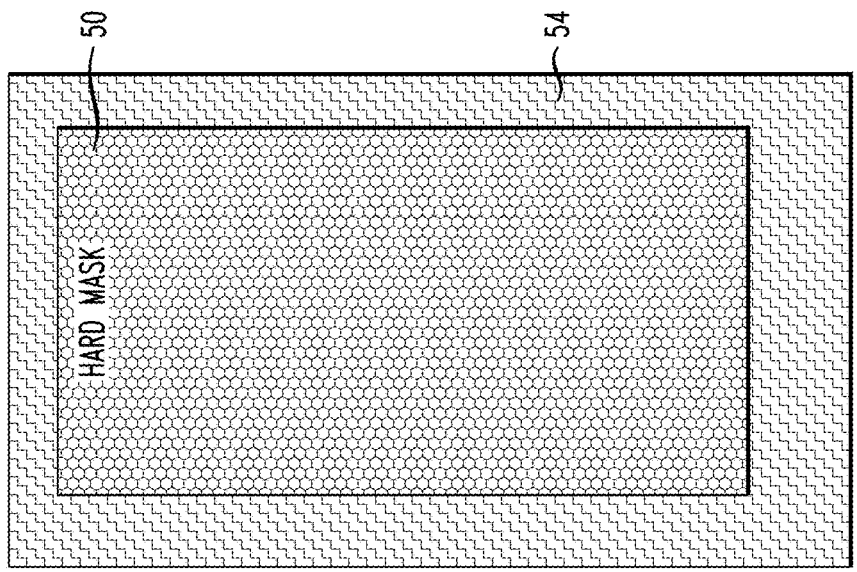
FIGS. 13A and 13B are schematic, cross-sectional and top plan views, respectively, following epitaxial growth of extrinsic base material on the base region.
Figure 13A:
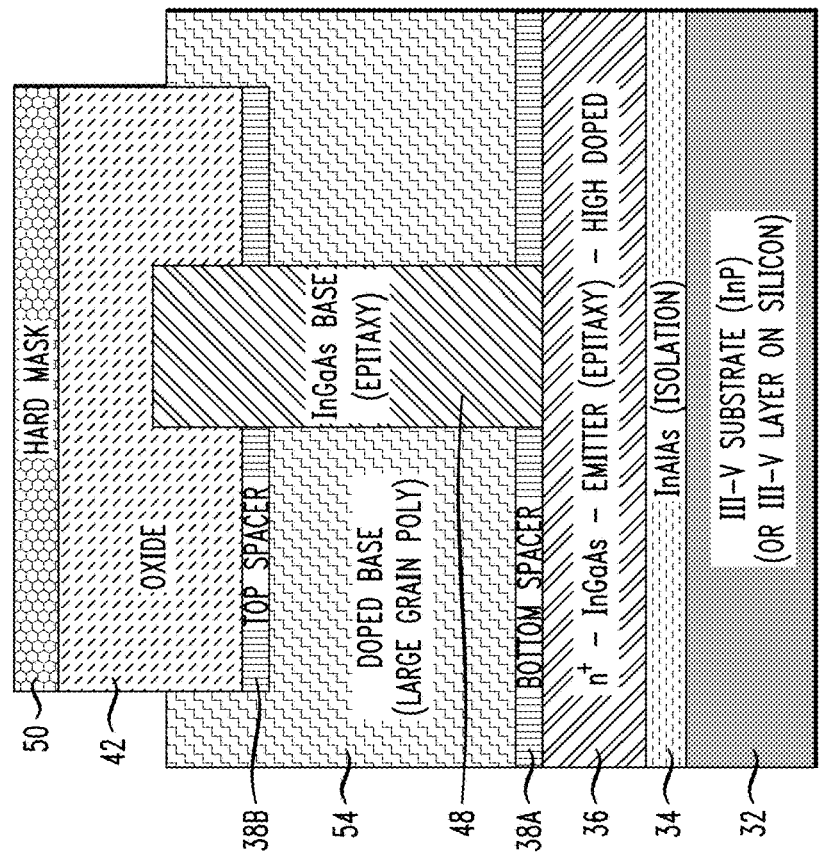

A doped, extrinsic base 54 is epitaxially grown within the recess 52 on and all around the exposed III-V base material 48 (the epitaxial base region of a subsequently formed BJT), thereby obtaining a structure as shown in FIGS. 13A and 13B. The doping concentration of the extrinsic base 54 in one or more embodiments is in the range of $4\times10^{19}$ atoms/$cm^3$ to $6\times10^{21}$ atoms/$cm^3$. The extrinsic base epitaxy is highly defective due to lattice mismatch and/or the imperfect exposed surfaces of the base material 48. Exemplary doped extrinsic base materials in some embodiments include silicon, silicon germanium, and germanium. The defective epitaxy, rather than being single crystalline, includes large single crystals with grain boundaries. The extrinsic base 54 is bounded by the bottom and top horizontal spacers 38A, 38B and extends completely around the III-V base material 48 with which it is operatively associated. Large grain polysilicon having p-type conductivity comprises the extrinsic base 54 in an exemplary embodiment where the intrinsic, epitaxial base region is also p-type. Defects within the extrinsic base 54 will not propagate into the base epitaxy (base material 48), which is used as a seed layer, upon epitaxial growth of the extrinsic base 54 thereon. Doped poly-SiGe, doped poly-Ge and doped III-V compound semiconductor materials are among the materials that may alternatively be employed for the extrinsic base 54 of the exemplary structure.

Following formation of the doped, extrinsic base 54, the extrinsic base material is recessed using a reactive ion etch. The hard mask 50 protects the layers beneath it, including the oxide layer 42, the top spacer 38B, the base material 48 and a portion of the extrinsic base 54 around the base material. The bottom spacer 38A functions as an etch stop following removal of the selected portion of the extrinsic base material. FIGS. 14A and 14B schematically illustrate an exemplary structure 60 following recessing of the extrinsic base material.

Figure 15A:
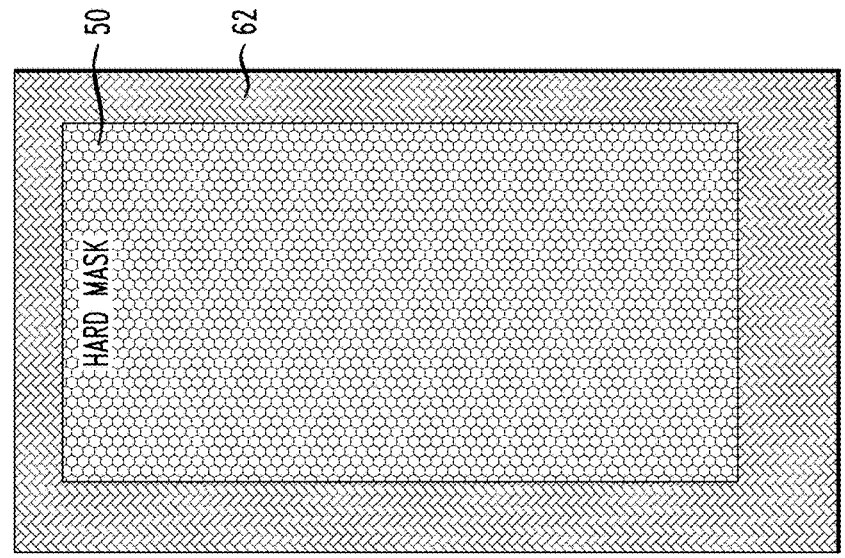
FIGS. 15A and 15B are schematic, cross-sectional and top plan views, respectively, of the structure shown in FIGS. 14A and 14B following deposition of an interlayer dielectric (ILD) layer.
Figure 15B:
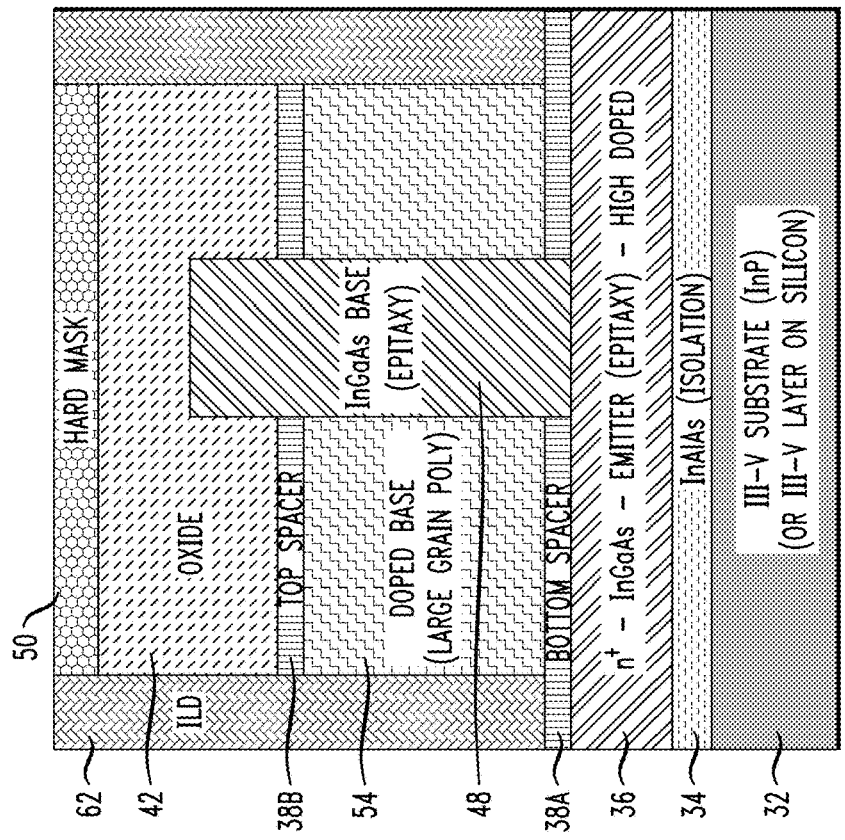

Referring to FIGS. 15A and 15B, an interlayer dielectric (ILD) layer 62, for example silicon dioxide or a low-k dielectric such as SiOCH, is formed on the structure using CVD or other known techniques. The ILD layer 62 may be formed from other dielectric materials, including but not limited to, spin-on-glass, a flowable oxide, a high density plasma oxide, borophosphosilicate glass (BPSG), or any combination thereof. The ILD layer is deposited by any suitable deposition process, including, but not limited to CVD, PVD, plasma-enhanced CVD, atomic layer deposition (ALD), evaporation, chemical solution deposition, or like processes. The outer surfaces of the doped, extrinsic base 54 are protected by the ILD layer. The ILD layer 62 is planarized using chemical mechanical planarization (CMP), as known in the art, down to the top surface of the hard mask, to obtain a structure as schematically illustrated in FIGS. 15A and 15B.

Figure 16A:
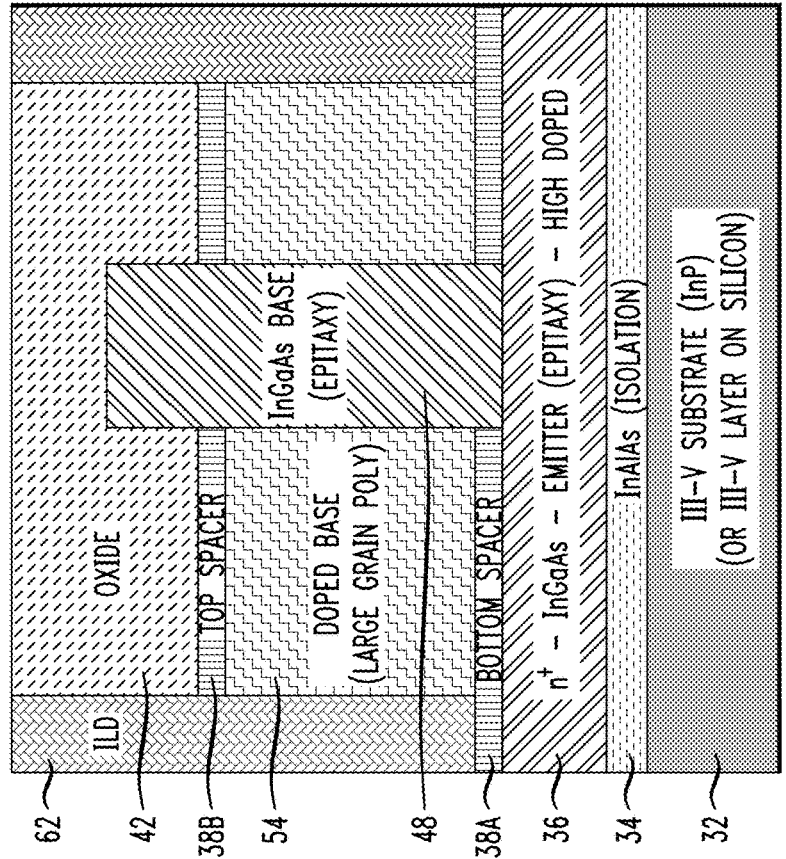
FIGS. 16A and 16B are schematic, cross-sectional and top plan views, respectively, of the structure shown in FIGS. 15A and 15B following removal of the hard mask and planarization.
Figure 16B:
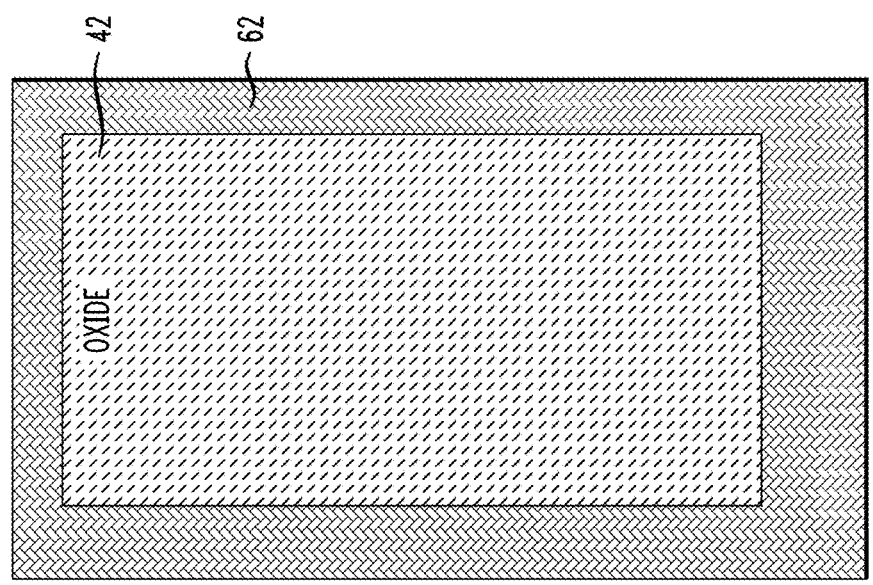
Figure 17B:
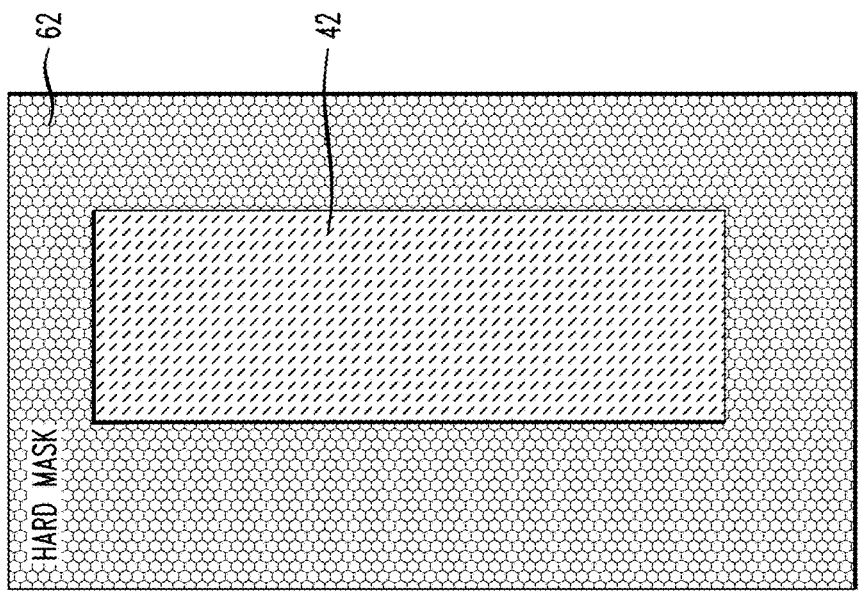
FIGS. 17A and 17B are schematic, cross-sectional and top plan views, respectively, of the structure shown in FIGS. 16A and 16B following formation of a patterned collector mask.
Figure 17A:
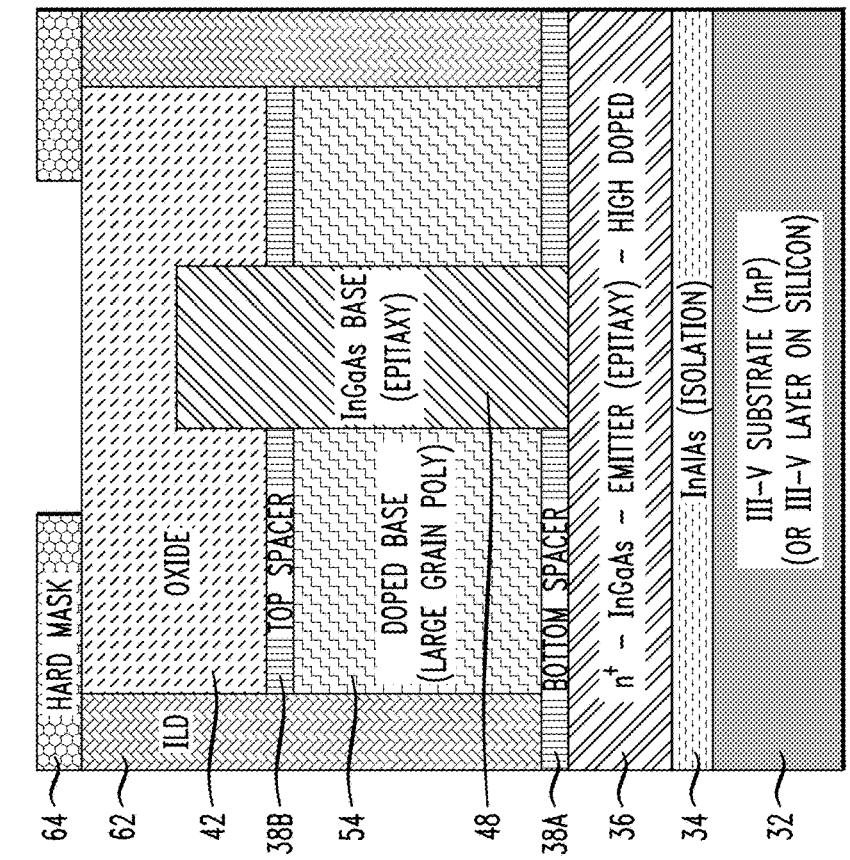

The hard mask 50 over the base region is removed and the top surface is planarized to obtain the structure shown in FIGS. 16A and 16B. A second hard mask 64 is then deposited and patterned on the top surface of the structure. The second hard mask includes an opening above the base region while protecting other regions of the structure. FIGS. 17A and 17B schematically illustrate the structure following mask deposition and patterning.

Using the second hard mask 64, a recess 66 is formed (see FIG. 18A) in the structure that extends through the oxide layer 42 down to the top spacer 38B. The portion of the III-V base material 48 extending above the top spacer 38B is also removed. A reactive ion etch (RIE) may be employed to selectively remove the oxide material and the III-V material therein. Etching of the III-V material is timed or otherwise controlled to avoid removing III-V material beneath the top spacer 38B. The etch is selective to the top spacer material, which is silicon nitride in the exemplary embodiment.

Figure 19B:
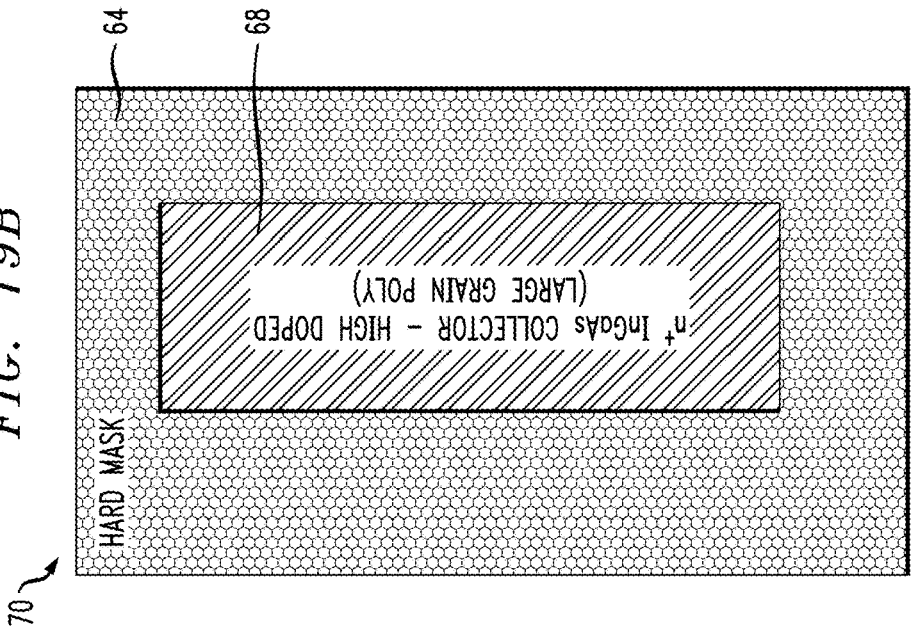
FIGS. 19A and 19B are schematic, cross-sectional and top plan views, respectively, of the structure shown in FIGS. 18A and 18B following epitaxial growth of collector material.
Figure 19A:
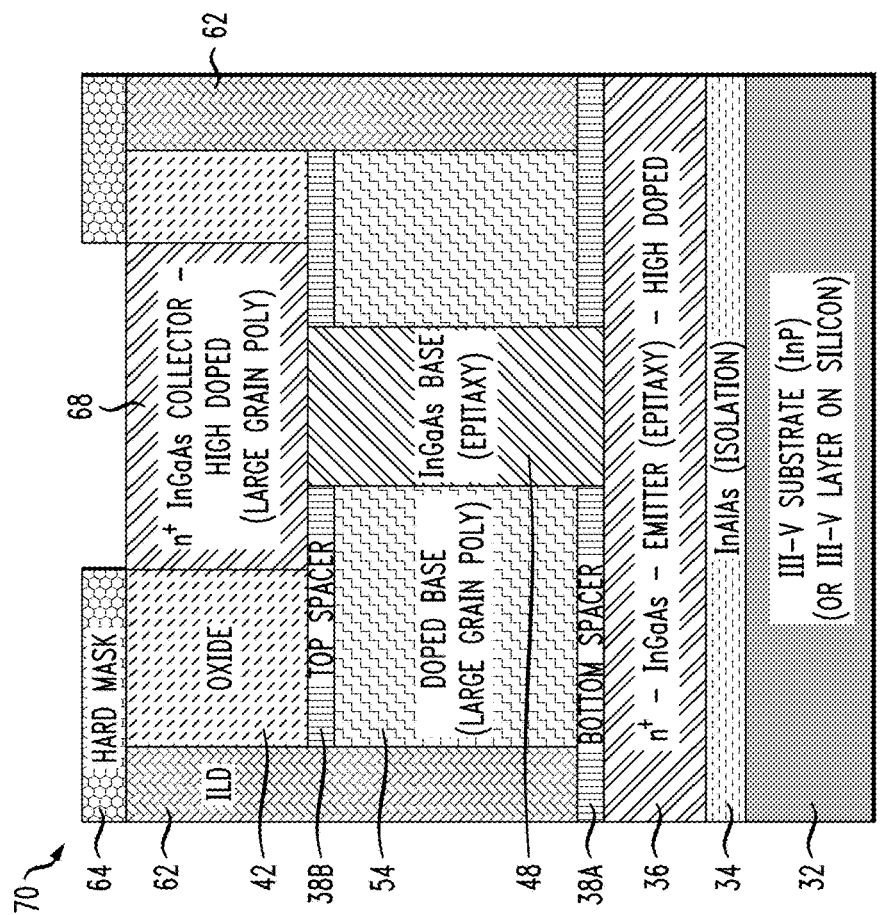

A second (top) heavily doped III-V compound semiconductor layer 68 that may later function as a BJT collector is epitaxially grown on the exposed top surface of the base material 48 and within the recess 66. The dopants in the second semiconductor layer 68 of the BJT may be incorporated in situ using appropriate precursors, as known in the art. The epitaxy may be essentially polycrystalline rather than single crystal due to surface imperfections of the base material 48 on which the semiconductor layer 68 is grown. Defects in the top III-V compound semiconductor layer 68 may further arise due to lateral growth along the top spacer 38B and along the sidewalls of the oxide layer 42. Defects within the large grain epitaxy will not, however, propagate into the underlying base epitaxy. In one exemplary embodiment, a heavily doped polycrystalline InGaAs layer grown on the base material 48 has a doping concentration of 1e19-2e21 $cm^{-3}$ or greater and n-type conductivity. FIGS. 19A and 19B provide cross-sectional and top plan views that schematically illustrate the resulting structure 70, it being appreciated that either of the heavily doped III-V compound semiconductor layers 36, 68 within the structure 70, being of the same material though having different crystal structures, can be employed either as an emitter or a collector. The second hard mask 64 is removed and the structure is optionally planarized to obtain the structure 75 schematically shown in FIGS. 20A and 20B.

Figure 21:
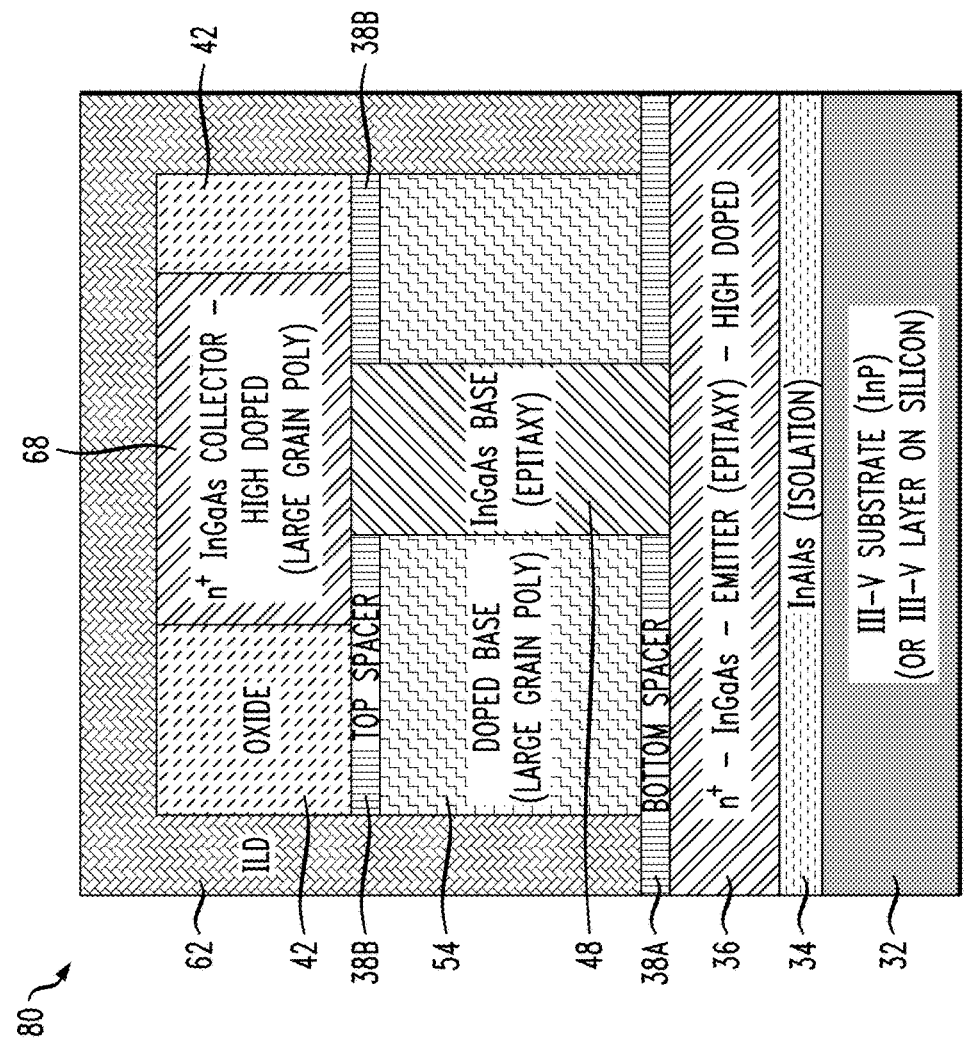
FIG. 21 is a schematic, cross-sectional view thereof following deposition of an interlayer dielectric (ILD) layer on the structure shown in FIGS. 20A and 20B followed by planarization.

ILD material is deposited on the structure 75 and planarized to obtain the structure 80 shown in FIG. 21. The deposited ILD material and the ILD material already on the structure form the ILD layer 62 shown in FIG. 21. Emitter, base and collector contacts 82, 84, 86 are formed within the structure 80. Photolithographic and etching techniques known to the art may be employed to form trenches within the ILD layer and other layers prior to metal deposition. Contact material may, for example, include aluminum (Al), platinum (Pt), gold (Au), tungsten (W), titanium (Ti), palladium (Pd) or any combination thereof. Exemplary processes for depositing contact material include CVD, PECVD, PVD, plating, thermal or e-beam evaporation, or sputtering. A planarization process, for example, CMP, is performed to remove any electrically conductive material from the top surface of the ILD layer. A final structure 100 including a vertical single column BJT device with an all-around base structure 54 and emitter, base and collector contacts 82, 84, 86 is shown in FIGS. 1A and 1B.

It is to be appreciated that the various layers and/or regions shown in the accompanying figures may not be drawn to scale. Furthermore, one or more layers of a type commonly used in such integrated circuit devices may not be explicitly shown in a given figure for ease of explanation.

This does not imply that the layer(s) not explicitly shown are omitted in the actual integrated circuit device.

Given the discussion thus far, it will be appreciated that, in general terms, an exemplary single column bipolar junction transistor device as disclosed herein includes a substrate 32 including a III-V compound semiconductor surface and an isolation layer 34 on the III-V compound semiconductor surface. A vertical column of semiconductor layers is on the isolation layer. The vertical column includes a bottom semiconductor layer 36 having a first conductivity type. The bottom semiconductor layer is heavily doped and consists essentially of an epitaxially grown III-V compound semiconductor material. In some embodiments, the bottom semiconductor layer is optionally functional as an emitter. The isolation layer is between the III-V compound semiconductor surface and the bottom semiconductor layer and provides electrical isolation. The column further includes a heavily doped top III-V compound semiconductor layer 68 which also has the first conductivity type. The top semiconductor layer 68 is optionally functional as a collector of a BJT in some embodiments. A doped III-V compound semiconductor base layer 48 having a second conductivity type opposite to the first conductivity type, which is epitaxially grown on the bottom semiconductor layer 36, is located between and directly contacts the bottom and top semiconductor layers. A doped extrinsic base 54 completely surrounds and directly contacts the base layer 48. A base contact 84 is electrically connected to the doped extrinsic base. The isolation layer 34 in one or more embodiments consists essentially of a III-V compound semiconductor material having a wider bandgap than the bottom semiconductor layer 36. The bottom semiconductor layer and the isolation layer have substantially the same lattice constants. As shown in FIG. 1A and/or FIG. 1B, the single column bipolar junction transistor device may further include an emitter contact 82 electrically connected to the bottom semiconductor layer, and a collector contact 86 electrically connected to the top semiconductor layer. Both the doped extrinsic base 54 and the top semiconductor layer may comprise polycrystalline semiconductor materials. Defects within the polycrystalline semiconductor materials will not propagate into the base layer 48 on which they are grown.

Figure 12:
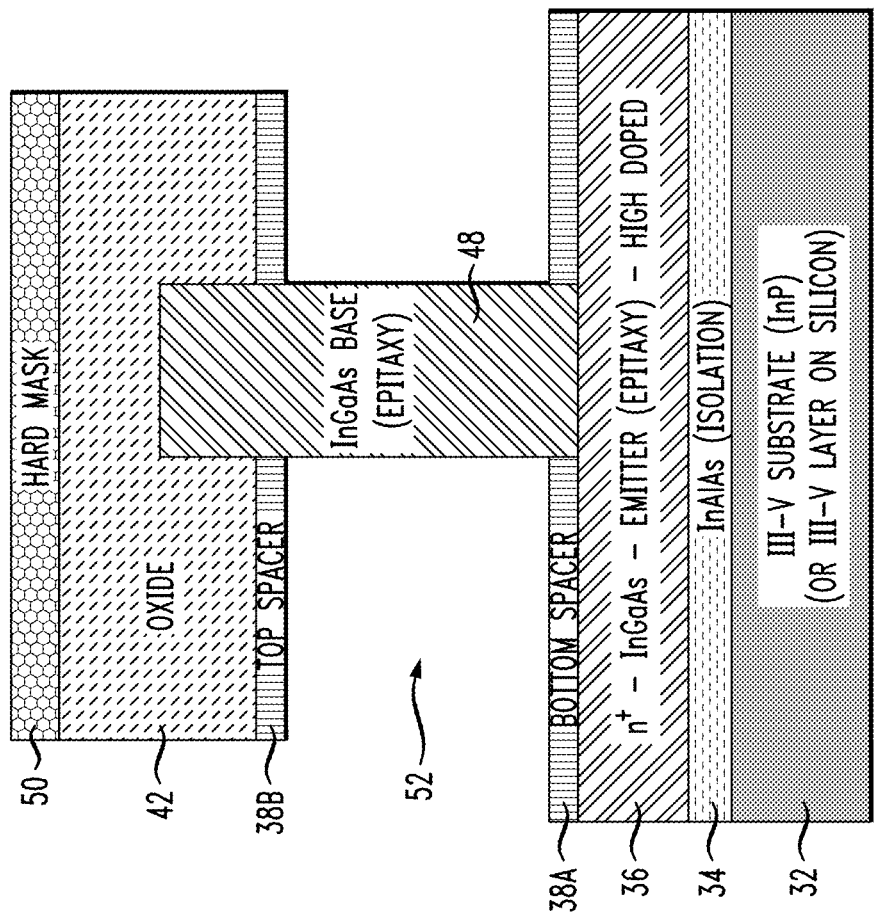
FIG. 12 is a schematic, cross-sectional view thereof following removal of an oxide liner from the base region.

Given the discussion thus far, it will also be appreciated that an exemplary method for fabricating a structure including a single column bipolar junction transistor device is provided. The method includes obtaining a multi-layer structure including a substrate including a III-V compound semiconductor surface, an isolation layer 34 on the III-V compound semiconductor surface, and a bottom semiconductor layer 36 having a first conductivity type. The bottom semiconductor layer 36 is heavily doped and consists essentially of a III-V compound semiconductor material. The isolation layer 34 is between the III-V compound semiconductor surface and the bottom semiconductor layer 36 and provides electrical isolation between the substrate and the bottom semiconductor layer. The multilayer structure further includes a sacrificial layer 40 over the bottom semiconductor layer 36 and a dielectric layer 42 over the sacrificial layer 40. FIG. 2 illustrates a multilayer structure including the above layers. A vertically extending trench 44 is formed through the dielectric layer and the sacrificial layer, such as shown in FIGS. 3A and 3B. A doped III-V compound semiconductor base layer 48 is epitaxially grown on the bottom semiconductor layer 36 and within the trench 44, the base layer having a second conductivity type opposite to the first conductivity type. Following removal of the sacrificial layer to form a space extending around the base layer, a doped extrinsic base 54 is grown on and completely surrounding the base layer 48. The extrinsic base extends within the space extending around the base layer. A top III-V compound semiconductor layer 68 is grown on a top surface of the base layer, the top semiconductor layer being heavily doped and having the first conductivity type. The doping concentrations of the bottom and top semiconductor layers 36, 68 allow their use as emitter and collector regions of a BJT. Doping is conducted in situ in the exemplary embodiments. In some embodiments, the bottom semiconductor layer, the top semiconductor layer and the base layer consist essentially of the same III-V compound semiconductor material (e.g. InGaAs) and form a homojunction BJT. Heterojunction BJTs are formed in alternative embodiments of the method. The method may further include forming an oxide liner 46 on the sacrificial layer 40 and bounding the trench 44, such as shown in FIG. 4. As further shown in FIG. 2, the method may further include depositing a bottom spacer 38A such as a nitride spacer on a top surface of the bottom semiconductor layer 36 and a top spacer 38B on the a top surface of the sacrificial layer 40. The space 52 extending around the base layer is bounded by the bottom and top spacers, as shown in FIGS. 11A and 12. The multi-layer structure may be formed in part by epitaxially growing the bottom semiconductor layer 36 on the isolation layer 34, wherein the isolation layer consists essentially of a second III-V compound semiconductor material having a wider bandgap than the III-V compound semiconductor material of the bottom semiconductor layer. Growing the doped extrinsic base and the top semiconductor layer may cause polycrystalline growth.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary devices illustrated in the accompanying figures, or portions thereof, may be part of an integrated circuit. Integrated circuits so manufactured are considered part of this disclosure.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having compound semiconductor BJTs therein formed in accordance with one or more of the exemplary embodiments. High performance and/or high voltage applications are among the uses of bipolar junction transistors that can be fabricated using the principles described herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "on" or "directly on" another layer, direct contact of the two layers is indicated.

The corresponding structures, materials, acts, and equivalents of means or step-plus-function elements, if any, in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A single column bipolar junction transistor device, comprising:
    a substrate including a III-V compound semiconductor surface;
    an isolation layer on the III-V compound semiconductor surface;
    a vertical column on the isolation layer, the vertical column including:
        a bottom semiconductor layer having a first conductivity type, the bottom semiconductor layer being heavily doped and consisting essentially of an epitaxially grown III-V compound semiconductor material, the isolation layer being between the III-V compound semiconductor surface and the bottom semiconductor layer,
        a top semiconductor layer consisting essentially of a III-V compound semiconductor material, the top semiconductor layer being heavily doped and having the first conductivity type, and
        a doped III-V compound semiconductor base layer having a second conductivity type opposite to the first conductivity type, the base layer being epitaxial to the bottom semiconductor layer and located between and directly contacting the bottom and top semiconductor layers; and
    a doped extrinsic base completely surrounding and directly contacting the base layer, and a base contact electrically connected to the doped extrinsic base;
    wherein the doped extrinsic base comprises a polycrystalline semiconductor material and the III-V compound semiconductor material of top semiconductor layer includes a polycrystalline structure.

2. The single column bipolar junction transistor device of claim 1, further including:
    a top dielectric spacer on a top surface of the doped extrinsic base, the top dielectric spacer electrically insulating the doped extrinsic base from the top semiconductor layer, and
    a bottom dielectric spacer on a bottom surface of the doped extrinsic base, the bottom dielectric spacer electrically insulating the doped extrinsic base from the bottom semiconductor layer.

3. The single column bipolar junction transistor device of claim 2, wherein the bottom semiconductor layer has a greater width than the base layer.

4. The single column bipolar junction transistor device of claim 2, wherein the doped extrinsic base consists essentially of doped polysilicon.

5. The single column bipolar junction transistor device of claim 1, wherein the isolation layer consists essentially of a III-V compound semiconductor material having a wider bandgap than the bottom semiconductor layer, the bottom semiconductor layer and the isolation layer being in direct contact and having substantially the same lattice constants.

6. The single column bipolar junction transistor device of claim 2, further including: an emitter contact electrically connected to the bottom semiconductor layer, and a collector contact electrically connected to the top semiconductor layer.

7. The single column bipolar junction transistor device of claim 1, wherein the top semiconductor layer, the bottom semiconductor layer, and the base layer consist essentially of the same III-V compound semiconductor material.

8. A single column bipolar junction transistor device, comprising:
   a substrate including a III-V compound semiconductor surface;
   an isolation layer on the III-V compound semiconductor surface;
   a vertical column on the isolation layer, the vertical column including:
      a bottom semiconductor layer having a first conductivity type, the bottom semiconductor layer being heavily doped and consisting essentially of an epitaxially grown III-V compound semiconductor material, the isolation layer being between the III-V compound semiconductor surface and the bottom semiconductor layer,
      a top semiconductor layer consisting essentially of a III-V compound semiconductor material, the top semiconductor layer being heavily doped and having the first conductivity type, and
      a doped III-V compound semiconductor base layer having a second conductivity type opposite to the first conductivity type, the base layer being epitaxial to the bottom semiconductor layer and located between and directly contacting the bottom and top semiconductor layers;
   a doped extrinsic base completely surrounding and directly contacting the base layer, and a base contact electrically connected to the doped extrinsic base;
   a top dielectric spacer on a top surface of the doped extrinsic base, the top dielectric spacer electrically insulating the doped extrinsic base from the top semiconductor layer, and
   a bottom dielectric spacer on a bottom surface of the doped extrinsic base, the bottom dielectric spacer electrically insulating the doped extrinsic base from the bottom semiconductor layer.

9. The single column bipolar junction transistor device of claim 8, wherein the doped extrinsic base comprises a polycrystalline semiconductor material and the III-V compound semiconductor material of top semiconductor layer includes a polycrystalline structure.

10. The single column bipolar junction transistor device of claim 8, wherein the isolation layer consists essentially of a III-V compound semiconductor material having a wider bandgap than the bottom semiconductor layer, the bottom semiconductor layer and the isolation layer being in direct contact and having substantially the same lattice constants.

11. The single column bipolar junction transistor device of claim 10, further including: an emitter contact electrically connected to the bottom semiconductor layer, and a collector contact electrically connected to the top semiconductor layer.

12. The single column bipolar junction transistor device of claim 8, wherein the top semiconductor layer, the bottom semiconductor layer, and the base layer consist essentially of the same III-V compound semiconductor material.

* * * * *